United States Patent
Menut et al.

(10) Patent No.: US 6,537,873 B2
(45) Date of Patent: Mar. 25, 2003

(54) INTEGRATED CIRCUIT COMPRISING A MEMORY CELL OF THE DRAM TYPE, AND FABRICATION PROCESS

(75) Inventors: Olivier Menut, Grenoble (FR); Yvon Gris, Tullins (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/044,812

(22) Filed: Jan. 11, 2002

(65) Prior Publication Data
US 2002/0119620 A1 Aug. 29, 2002

(30) Foreign Application Priority Data
Jan. 12, 2001 (FR) .............................. 01 00418

(51) Int. Cl.[7] .......................................... H01L 21/8242
(52) U.S. Cl. ...................... 438/245; 438/243; 438/244; 438/386; 438/387; 438/388
(58) Field of Search ................ 438/243–249, 438/386–392; 257/301

(56) References Cited

U.S. PATENT DOCUMENTS

| | | | | |
|---|---|---|---|---|
| 4,676,847 A | * | 6/1987 | Lin | ............................ 438/564 |
| 5,543,348 A | * | 8/1996 | Hammerl et al. | ........... 438/249 |
| 5,641,694 A | | 6/1997 | Kenney | |
| 5,843,820 A | * | 12/1998 | Lu | ............................... 438/243 |
| 5,893,735 A | * | 4/1999 | Stengl et al. | ................ 438/243 |
| 5,998,821 A | | 12/1999 | Hieda et al. | |
| 6,093,614 A | * | 7/2000 | Gruening et al. | ........... 438/388 |
| 6,207,493 B1 | * | 3/2001 | Furukawa et al. | ........... 438/246 |
| 6,214,653 B1 | * | 4/2001 | Chen et al. | .................. 438/153 |
| 6,238,967 B1 | * | 5/2001 | Shiho et al. | ................ 438/244 |

FOREIGN PATENT DOCUMENTS

| | | | |
|---|---|---|---|
| DE | 19752968 C1 | * 6/1999 | ....... H01L/21/8242 |
| EP | 0905771 A2 | 3/1999 | |
| JP | 63110770 | 5/1988 | |
| JP | 09064301 | 3/1997 | |

OTHER PUBLICATIONS

"One–Device CMOS Dram Cell with Buried Poly Trench and Drain Reach Through," IBM Technical Disclosure Bulletin, vol. 30, No. 11, pp. 451–452, Apr. 1, 1988, XP000035475.

"Vertical Conducting Connection to a Poly–Si Trench in Si," IBM Technical Disclosure Bulletin, vol. 31, No. 12, pp. 310–312, May 1, 1989, XP000097262.

French Preliminary Search Report dated Sep. 14, 2001 for French Patent Application No. 0100418.

* cited by examiner

Primary Examiner—John F. Niebling
Assistant Examiner—Jennifer M. Kennedy
(74) Attorney, Agent, or Firm—Lisa K. Jorgenson; Jose Gutman; Fleit, Kain, Gibbons, Gutman & Bongini P.L.

(57) ABSTRACT

The integrated circuit comprises a semiconductor substrate SB supporting a memory cell PM of the DRAM type comprising an access transistor T and a storage capacitor TRC. The access transistor is made on the substrate, and the substrate includes a capacitive trench TRC buried beneath the transistor and forming the storage capacitor, the capacitive trench being in contact with one of the source and drain regions of the transistor.

14 Claims, 2 Drawing Sheets

US 6,537,873 B2

INTEGRATED CIRCUIT COMPRISING A MEMORY CELL OF THE DRAM TYPE, AND FABRICATION PROCESS

CROSS-REFERENCE TO RELATED APPLICATIONS

This application is based upon and claims priority from prior French Patent Application No. 0100418, filed on Jan. 12, 2001, the entire disclosure of which is herein incorporated by reference.

BACKGROUND OF THE INVENTION

1. Field of the Invention

The invention relates to integrated circuits, and more particularly to dynamic random access memory cells of the DRAM (Dynamic Random Access Memory) type.

2. Description of the Prior Art

A memory cell of the DRAM type must be as small as possible for the sake of density. It consists of an access transistor controlling the charging or the discharging of a capacitor. This capacitor must, on the one hand, have a maximum capacitance and, on the other hand, occupy a minimum surface. Currently, the capacitor is made either in the silicon substrate or in the upper interconnect layers of the integrated circuit.

In the first case, the capacitor is located at the side of the access transistor. In the second case, the capacitor occupies a large volume above the transistor, a volume that cannot be used to make interconnections in the integrated circuit.

In both cases, the density of the memory cell, that is to say its overall size, is affected thereby.

Moreover, processes for fabricating semiconductor components may destroy the crystalline continuity of the surface of part of the initial single-crystal semiconductor substrate. This is especially the case when producing a trench. At the position of the trench, the semiconductor substrate has a different material without any crystalline structure. Consequently, the surface of that part of the substrate which is occupied by the trench cannot be used to produce semiconductor devices.

Accordingly, there exists a need for overcoming the disadvantages of the prior art as discussed above.

SUMMARY OF THE INVENTION

A main aim of the invention is to provide a solution to the problems discussed above.

One aim of the invention is to produce a single-crystal substrate allowing the subsequent formation of a silicon epitaxial layer that is free of crystal defects and in which the transistor of the memory cell will be produced.

Another aim of the invention is to propose a semiconductor device operating as a memory cell of the DRAM type, and having a minimum overall size.

The invention therefore proposes a process for fabricating an integrated circuit comprising a semiconductor substrate supporting a memory cell of the DRAM type having an access transistor and a storage capacitor. According to a general characteristic of the invention, a) an initial single-crystal substrate having locally a capacitive trench containing a polycrystalline fill material emerging at the surface of the initial substrate and forming a discontinuity in the crystal lattice is prepared;

b) the initial substrate is recessed at the trench;

c) the single-crystal lattice of the substrate around the periphery of the recess and the emergent part of the polycrystalline material for filling the trench are amorphized locally and so as to be self-aligned with respect to the trench;

d) a layer of amorphous material having the same chemical composition as that of the initial substrate is deposited on the structure obtained in the previous step;

e) the structure obtained in the previous step is thermally annealed in order to recrystallize the amorphous material so as to be continuous with the single-crystal lattice of the initial substrate;

f) an upper substrate layer, in and on which the access transistor is made, is grown by epitaxy, the capacitive trench forming the storage capacitor being in contact with one of the source and drain regions of the transistor.

According to one implementation mode, the process comprises, prior or subsequent to step e), a surface planarization step, for example a chemical-mechanical polishing operation.

According to one implementation mode, the amorphization step comprises ion implantation localized around the recess by means of a masking operation.

According to one implementation mode, in step a), a first layer of a first material and a second layer of a second material are deposited in succession on the initial substrate, then a trench is etched, which is filled with a fill material, and in step b), the first layer and an upper portion of the trench fill material are selectively etched with respect to the second layer so as to form lateral cavities and the recess at the crystal discontinuity, and the second layer is removed.

In step a), the filling of the trench advantageously comprises the following steps:

the walls of the trench are lined with oxide by thermal oxidation;

highly doped polycrystalline silicon is deposited in the trench so as to fill it;

the polycrystalline silicon deposited previously is etched so that the fill level of the trench is below the surface of the initial substrate.

The subject of the invention is also an integrated circuit obtained by the fabrication process as defined above and comprising a semiconductor substrate supporting a memory cell of the DRAM type comprising an access transistor and a storage capacitor.

Thus, the substrate includes at least one capacitive trench buried beneath the transistor and forming the storage capacitor, the capacitive trench being in contact with one of the source and drain regions of the transistor.

In other words, the memory cell thus obtained according to the invention is a transistor with a capacitor of the buried-trench type, the trench being located not beside the transistor but beneath the transistor. The footprint is therefore reduced. The first electrode of the capacitor is the substrate and the second electrode is a conductor filling the trench. This capacitor is located beneath a diffusion region (drain or source) of the access transistor and is connected to this diffusion region by direct contact between the internal electrode of the capacitor and this diffusion region.

The substrate is, for example, formed from silicon and the capacitive trench includes a doped-silicon internal region partially surrounded by an isolating wall which laterally separates the internal region from the substrate and is surmounted by a doped-silicon upper region, this upper region being in contact with the source or drain region of the transistor.

According to one embodiment, the substrate includes a highly doped lower part of p-type conductivity, preferably with a dopant concentration of greater than $10^{18}$ at/cm$^3$, for example $10^{19}$ at/cm$^3$, and an upper part of p-type conductivity, but less doped than the lower part. The internal region and the upper region of the capacitive trench have an n-type conductivity and the source and drain regions of the transistor also have an n-type conductivity.

BRIEF DESCRIPTION OF THE DRAWING

Other advantages and characteristics of the invention will appear on examining the detailed description of embodiments and of implementation modes, which are in no way limiting, and the appended drawings in which.

DESCRIPTION OF THE PREFERRED EMBODIMENTS

Figure 1A:
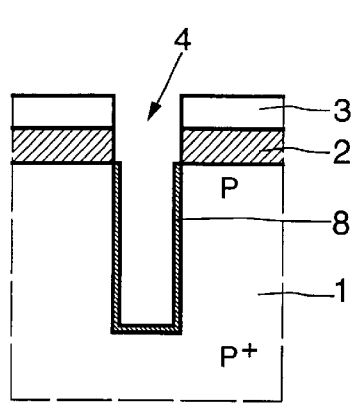
FIGS. 1a to 1h illustrate schematically the main steps of a process according to the invention together with an embodiment of a memory cell according to the invention.

The starting substrate of the process for the invention, or the initial substrate, is illustrated in FIG. 1a and in this case comprises a trench. The initial substrate 1 has a lower p$^+$-doped portion (concentration of dopants equal to $10^{19}$ at/cm$^3$). The substrate also has an upper portion epitaxially grown on the lower part and p-doped with a concentration of $5 \times 10^{14}$ at/cm$^3$. The trench may be formed, according to one process for implementing the process of the invention, by firstly depositing a silicon oxide layer 2 on the initial single-crystal silicon substrate 1. The thickness of this layer 2 may vary between 0.01 microns and 1 micron, and is preferably about 2000 Å.

Next, a layer of silicon nitride 3 is deposited on the oxide 2. The thickness of this layer 3 may also vary between 0.01 microns and 1 micron, and is also preferably about 2000 Å.

Next, first of all the nitride 3 and the oxide 2, then finally the single-crystal silicon of the substrate 1 are etched in a conventional manner using a photolithography operation, in order to form the trench 4.

The trench 4 has a depth of at least 5 $\mu$m and a variable width, preferably less than 1 $\mu$m.

Next, a controlled thermal oxidation is carried out so as to form on the walls of the trench 4 a silicon oxide layer 8 having a thickness of between 40 and 1000 Å, preferably between 50 and 300 Å. The device illustrated in FIG. 1a is obtained.

Next, highly n$^+$-doped polycrystalline silicon 9 is deposited on the wafer so as to fill the trench 4. The doping of the silicon is carried out in situ.

Figure 1B:
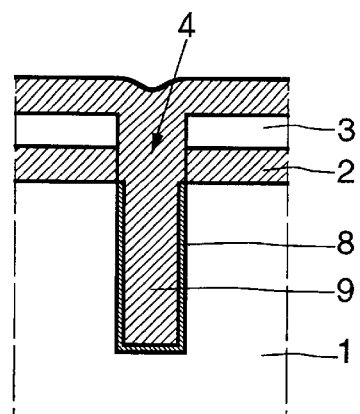

A device as illustrated in FIG. 1b is obtained.

Next, the polycrystalline silicon 9 deposited beforehand is etched, at least so as to remove it from the surface of the wafer. Moreover, this etching is carried out until the level of the polycrystalline silicon in the trench 4 is below the surface of the initial substrate 1.

Figure 1C:
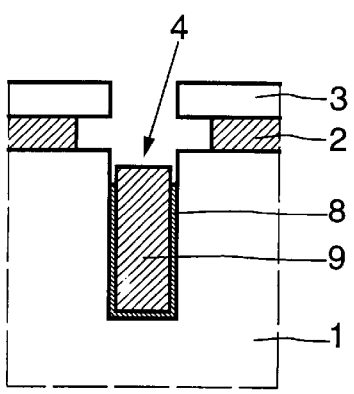

The next step consists of a controlled deoxidation, essentially so as to form, under the silicon nitride layer 3, two lateral cavities of given width in the oxide layer 2, as illustrated in FIG. 1c. Some of the silicon oxide 8 in the trench 4 is also removed.

This deoxidation is carried out by isotropic etching using hydrofluoric acid or else by isotropic plasma etching using fluorine. The device illustrated in FIG. 1c, in which the trench is lined with a silicon oxide layer 8 whose height is less than the height of the doped polycrystalline silicon layer 9 in the trench 4, is then obtained. Two lateral cavities of given width appear below the silicon nitride layer 3 and in the silicon oxide layer 2.

Next, the silicon nitride mask 3 is conventionally removed.

The exposed silicon is then amorphized.

Figure 1D:
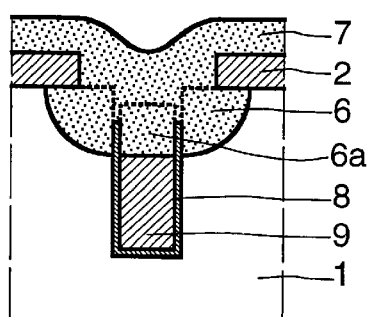

The silicon exposed at this stage of the process is the single-crystal silicon of the substrate 1 together with the emergent portion of doped polycrystalline silicon 9 in the trench 4. Thus, amorphous silicon regions labeled 6 and 6a are created (FIG. 1d).

The localized simultaneous amorphization of the regions 6 and 6a is self-aligned with respect to the trench. The amorphization is carried out conventionally by destroying the crystal lattice of the silicon and of the polycrystalline silicon 6a, for example by the implantation of heavy particles such as ions. Within the context of the invention, it will be especially preferred to implant fluoride ions.

Next, an amorphous silicon layer 7 is deposited over the entire surface of the wafer so as at least to fill the lateral cavities and the recess above the trench 4. The amorphous layer 7 deposited therefore acts as a link between the regions 6 and 6a and as a means of filling in the surface, and not as an active region. The amorphous silicon is deposited conventionally at low temperature. For example, it is possible to use an LPCVD (low-pressure chemical vapor deposition) furnace, injecting silane at a sufficiently low temperature, for example less than 600° C., typically less than 400° C. The device illustrated in FIG. 1d is thus obtained, in which, in a trench 4 etched in a substrate 1, a polycrystalline silicon block 9 is partially enveloped in a silicon oxide layer 8. The height of this block, less than that of the trench 4, is also less than the height of the silicon oxide envelope 8. This element is surmounted by an amorphous silicon region comprising the amorphized silicon regions 6 and 6a and the amorphous silicon 7 deposited.

Figure 1E:
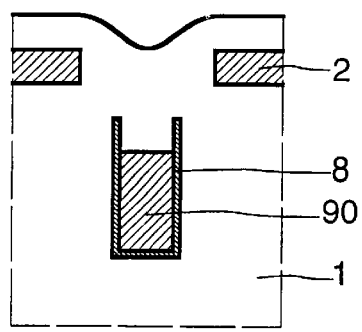

A thermal annealing operation is carried out so as to restore the crystal structure of the amorphous silicon. The thermal annealing allows the amorphous silicon to recrystallize, by the epitaxial regrowth of the amorphous silicon 6, 7 starting from the single-crystal silicon of the initial substrate 1. The restructuring of the single-crystal silicon lattice results in FIG. 1e in which the previous amorphous silicon layer now merges with the single-crystal silicon of the substrate 1.

It should be noted here that, according to the invention, the region 6 is spatially limited and that the boundary between this region 6 and the substrate 1 is easily localized by ion implantation. Moreover, this boundary is a "soft" boundary, that is to say the transition from the single-crystal Si state to the amorphous Si state is very gradual. These features result in the region 6 being very effectively recrystallized, and without any defects, something which cannot be easily obtained with a large surface area to be recrystallized.

In addition, the amorphization of the region 6a prevents crystal defects from "rising" into the single-crystal layer from the polycrystalline silicon.

Next, a chemical-mechanical polishing operation is carried out, stopping on the silicon oxide layer 2 in order to remove the recrystallized silicon layer on the surface of the wafer. The silicon oxide layer 2 is then conventionally removed. Next, in order to planarize the surface, the wafer is subjected to a final chemical-mechanical polishing operation.

Figure 1F:
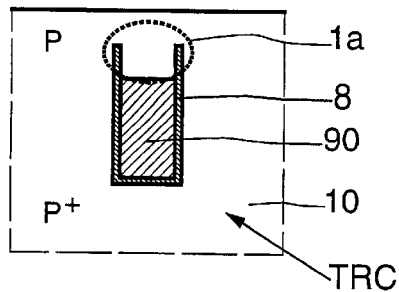

After the steps of making the surface of the substrate uniform, a final single-crystal silicon substrate 10 is obtained, illustrated in FIG. 1f, the perfectly planar and uniform single-crystal surface of which allows defect-free epitaxial growth of single-crystal silicon. The thickness of the substrate 10 above the trench is about 0.2 microns. Moreover, the substrate comprises a buried capacitive trench TRC, consequently having a minimum depth of about 5 microns, and consisting of highly doped polycrystalline silicon 90 partially enveloped by a silicon oxide wall 8 separating it laterally from the substrate 1. Above this buried capacitive trench and in the substrate 1, there remains a doped region 1a, of the same conductivity as the polycrystalline silicon 90. This region corresponds to the amorphized polycrystalline silicon region 6a and to the portion of silicon 7 doped by diffusion of dopants during annealing.

According to the invention, the localized destruction of the crystalline lattice, before its reconstruction, is particularly advantageous in the case of capacitive trenches, as it makes it possible to bury the polycrystalline silicon 90 (the entire capacitor) by controlled etching of the sidewall oxide 8, without it being necessary to provide an additional oxide.

Figure 1G:
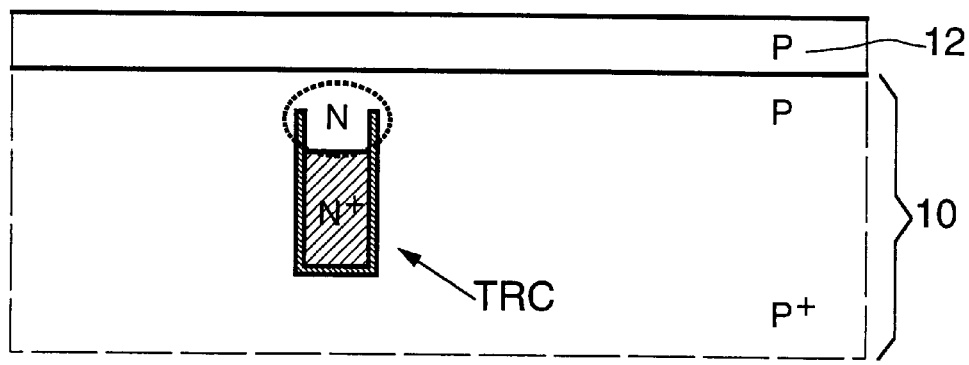

The process continues by the epitaxial growth on the surface of the substrate 10, of an upper substrate layer 12, made of p-doped silicon (FIG. 1g). It is in this layer 12 that the access transistor of the memory cell PM will be made.

Figure 1H:
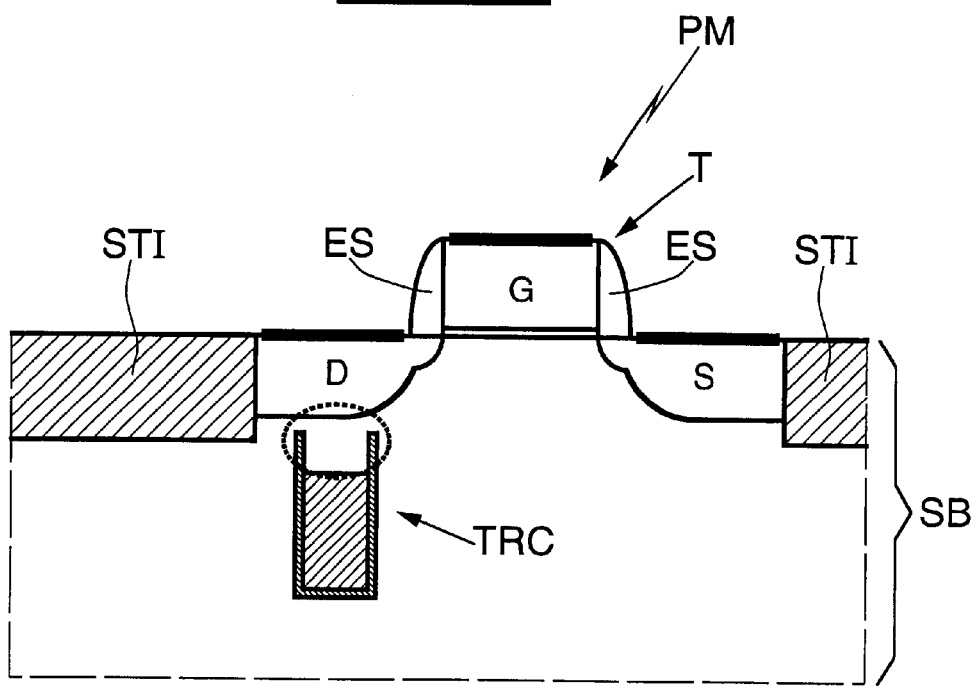

More specifically, as illustrated in FIG. 1h, the substrate SB, formed from the substrate 10 and from the layer 12, includes the capacitive trench TRC and the drain D and source S regions of the transistor T. The upper region 1a of the trench comes into electrical contact with the diffused region of the drain D.

The steps allowing the production of the transistor T are conventional and known per se to those skilled in the art. More specifically, lateral isolation regions STI are made. Then the gate oxide, followed by the gate polysilicon which is etched to form the isolated gate T of the transistor, are formed.

The drain and source regions are made conventionally by double implantation before and after forming isolating spacers ES flanking the gate. A conventional siliciding step makes it possible to metallize the drain, source and gate regions so as to provide electrical contacts.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating an integrated circuit comprising a semiconductor substrate supporting a memory cell of the DRAM type comprising an access transistor and a storage capacitor, wherein:

a) an initial single-crystal substrate having locally a capacitive trench containing a polycrystalline fill material emerging at the surface of the initial substrate and forming a discontinuity in the crystal lattice is prepared;

b) the initial substrate is recessed at the trench;

c) the single-crystal lattice of the substrate around the periphery of the recess and the emergent part of the polycrystalline material for filling the trench are amorphized locally and so as to be self-aligned with respect to the trench;

d) a layer of amorphous material having the same chemical composition as that of the initial substrate is deposited on the structure obtained in the previous step;

e) the structure obtained in the previous step is thermally annealed in order to recrystallize the amorphous material so as to be continuous with the single-crystal lattice of the initial substrate; and f) an upper substrate layer, in and on which the access transistor is made, is grown by epitaxy, the capacitive trench forming the storage capacitor being in contact with one of the source and drain regions of the transistor.

2. The process according to claim 1, wherein the amorphization step comprises ion implantation localized around the recess by means of a masking operation.

3. The process according to claim 1, wherein, in step a), a first layer of a first material and a second layer of a second material are deposited in succession on the initial substrate, then a trench is etched, which is filled with a fill material and in step b), the first layer and an upper portion of the trench fill material are selectively etched with respect to the second layer so as to form lateral cavities and the recess at the crystal discontinuity, and the second layer is removed.

4. The process according to claim 3, wherein, in step a), the filling of the trench comprises the following steps:

the walls of the trench are lined with oxide by thermal oxidation;

highly doped polycrystalline silicon is deposited in the trench so as to fill it; and the polycrystalline silicon deposited previously is etched so that the fill level of the trench is below the surface of the initial substrate.

5. The process according to claim 1, comprising:

prior or subsequent to step e), a surface planarization step.

6. The process according to claim 5, wherein, in step a), a first layer of a first material and a second layer of a second material are deposited in succession on the initial substrate, then a trench is etched, which is filled with a fill material and in step b), the first layer and an upper portion of the trench fill material are selectively etched with respect to the second layer so as to form lateral cavities and the recess at the crystal discontinuity, and the second layer is removed.

7. The process according to claim 6, wherein, in step a), the filling of the trench comprises the following steps:

the walls of the trench are lined with oxide by thermal oxidation;

highly doped polycrystalline silicon is deposited in the trench so as to fill it; and the polycrystalline silicon deposited previously is etched so that the fill level of the trench is below the surface of the initial substrate.

8. The process according to claim 5, wherein the amorphization step comprises ion implantation localized around the recess by means of a masking operation.

9. The process according to claim 5, wherein the planarization step comprises a chemical-mechanical polishing operation.

10. The process according to claim 9, wherein, in step a), a first layer of a first material and a second layer of a second material are deposited in succession on the initial substrate, then a trench is etched, which is filled with a fill material and in step b), the first layer and an upper portion of the trench fill material are selectively etched with respect to the second layer so as to form lateral cavities and the recess at the crystal discontinuity, and the second layer is removed.

11. The process according to claim 10, wherein, in step a), the filling of the trench comprises the following steps:

the walls of the trench are lined with oxide by thermal oxidation;

highly doped polycrystalline silicon is deposited in the trench so as to fill it; and the polycrystalline silicon deposited previously is etched so that the fill level of the trench is below the surface of the initial substrate.

12. The process according to claim 9, wherein the amorphization step comprises ion implantation localized around the recess by means of a masking operation.

13. The process according to claim 12, wherein, in step a), a first layer of a first material and a second layer of a second material are deposited in succession on the initial substrate, then a trench is etched, which is filled with a fill material and in step b), the first layer and an upper portion of the trench fill material are selectively etched with respect to the second layer so as to form lateral cavities and the recess at the crystal discontinuity, and the second layer is removed.

14. The process according to claim 13, wherein, in step a), the filling of the trench comprises the following steps:

the walls of the trench are lined with oxide by thermal oxidation;

highly doped polycrystalline silicon is deposited in the trench so as to fill it; and the polycrystalline silicon deposited previously is etched so that the fill level of the trench is below the surface of the initial substrate.

* * * * *